United States Patent [19]
Rosevear et al.
[11] 3,713,909
[45] Jan. 30, 1973

[54] METHOD OF PRODUCING A TUNNEL DIODE

[75] Inventors: Allan F. Rosevear, Irvine; Ferdinando M. Acampora, Buena Park, both of Calif.

[73] Assignee: North American Rockwell Corporation

[22] Filed: Nov. 6, 1970

[21] Appl. No.: 87,594

Related U.S. Application Data

[63] Continuation of Ser. No. 635,914, May 3, 1967, abandoned.

[52] U.S. Cl. .................148/179, 148/33.1, 148/180, 148/185
[51] Int. Cl. ................................................H01l 7/46
[58] Field of Search .......................148/177–185, 1.5, 148/33.1

[56] References Cited

UNITED STATES PATENTS

| | | | |
|---|---|---|---|
| 3,510,368 | 5/1970 | Hahn | 148/179 |
| 3,551,220 | 12/1970 | Meer et al. | 148/179 |
| 3,460,008 | 8/1969 | Dahlberg | 317/235 |
| 3,254,234 | 5/1966 | Sziklai | 307/88.5 |
| 3,383,907 | 5/1968 | Sikorski | 73/88.5 |
| 3,491,588 | 1/1970 | Yerman | 73/141 |

*Primary Examiner*—Richard O. Dean
*Attorney*—L. Lee Humphries

[57] ABSTRACT

A tunnel diode having a substantially flat junction area. The diode is fabricated on a heavily doped semiconductor substrate by chemical vapor deposition of a film of elemental dopant (of a conductivity type opposite that of the substrate) over the surface layer; depositing metal over a portion of the dopant film, the area covered corresponding to the desired shape of the diode junction; and alloying the metal, the dopant film and the surface layer to form a tunnel diode junction. Diodes thus produced exhibit strain sensitivity and may be used to measure the magnitude of bending stresses applied to the substrate.

8 Claims, 11 Drawing Figures

HEAVILY DOPE SURFACE LAYER OF SUBSTRATE

DEPOSIT FILM OF ELEMENTAL DOPANT

DEPOSIT METAL IN DIODE AREA

ALLOY AND QUENCH TO FORM TUNNEL DIODE JUNCTION

ATTACH ELECTRICAL CONDUCTORS

INVENTORS
FERDINANDO M. ACAMPORA
BY ALLAN F. ROSEVEAR
Howard A. Silber
ATTORNEY

INVENTORS
FERDINANDO M. ACAMPORA
ALLAN F. ROSEVEAR
BY Howard A. Silber
ATTORNEY

INVENTORS
FERDINANDO M. ACAMPORA
ALLAN F. ROSEVEAR
BY
Howard A. Silber
ATTORNEY

INVENTORS
FEDINANDO M. ACAMPORA
ALLAN F. ROSEVEAR
BY
Howard A. Silber
ATTORNEY

METHOD OF PRODUCING A TUNNEL DIODE

This is a continuation of application Ser. No. 635,914, filed May 3, 1967, now abandoned.

BACKGROUND OF THE INVENTION

1. Field of the Invention

This invention relates to a tunnel diode and method of producing it. More particularly, the invention relates to a tunnel diode having a substantially flat junction produced by the alloying of an undoped metal film, a thin film of elemental dopant, and an oppositely doped semiconductor substrate.

2. Description of the Prior Art

A tunnel diode is characterized by having a very thin p-n depletion junction situated between a degenerately doped semiconductor region and another degenerately doped region of opposite conductivity. Typically, the depletion junction has a thickness on the order of 150 A., and the degenerate regions on either side of the junction have doping levels on the order of $10^{19}$ impurity atoms per cubic centimeter or greater. When an appropriate value of forward bias is applied across such a diode junction, quantum mechanical tunneling occurs, i.e., electrons penetrate the junction energy barrier which normally they could not penetrate. The overlapping of energy bands in a tunneling junction gives the tunnel diode negative resistance characteristics over an appropriate range of forward bias across the junction.

Prior art tunnel diodes most commonly were formed by alloying to a very heavily doped semiconductor, a degenerately doped pellet having a diameter of less then 3 mils. For example, such a tunnel diode might be formed from germanium p-doped with gallium to a concentration of about $3 \times 10^{19}$ gallium atoms per cubic centimeter. A pellet 1 to 3 mils in diameter having 30 percent arsenic by weight (and hence degenerately doped n-type) is alloyed to the germanium to form the tunnel diode.

Tunnel junctions thus fabricated usually conformed to the shape of the pellet, typically hemispherical, and extended into the substrate by as much as 0.5 millimeters. Often a considerable portion of the diode junction thus formed was etched away to obtain the small junction areas required for high frequency operation. Such a diode was unsuitable for use as strain sensor because the junction, being non-planar, did not lie substantially within a single crystallographic plane of the substrate.

In another prior art tunnel diode fabrication technique, molten silicon, highly doped to a first conductivity type, was flowed over a substrate heavily doped to the opposite conductivity type. Upon recrystallization, a tunnel junction was formed at the boundary. Subsequently, etching was required to define individual diode mesas. Diodes formed in this manner are unsuitable for strain sensor application because the substrate semiconductor material planar with, and surrounding the junction, is etched away. This etching distorts and disrupts the strain fields, resulting in strain sensors having non-linear characteristics which vary from diode to diode.

Prior art tunnel diodes suffered other disadvantages. For example, etching of individual tunnel diode areas was required to produce diodes having a desired, specific peak current. Further, it was necessary to produce the tunnel diodes in highly doped degenerate silicon substrates. This material is difficult to obtain free of mechanical defects and resistivity nonuniformities. Then too, the prior art fabrication techniques did not allow incorporation of the tunnel diodes into integrated microcircuits.

The present invention provides a tunnel diode having a substantially planar p-n junction, disposed in a substrate the coplanar semiconductor material of which extends uninterruptedly in all directions from the junction. The inventive process allows fabrication of tunnel diodes, the area and shape of which may be controlled without the need for subsequent etching. Diodes thus produced have readily reproducible characteristics. Since the junctions extend only minutely into the semiconductor, the diodes may be formed on a substrate material only a thin surface layer of which need be degenerately doped. The diodes are particularly useful in strain sensor applications.

SUMMARY OF THE INVENTION

The invention which forms the subject matter of this application comprises a process for fabricating a tunnel diode having a flat junction, and controlled geometry and electrical characteristics. The inventive tunnel diodes produced by this technique are particularly well suited for strain sensor applications.

The inventive process includes the steps of chemical vapor phase depositing a layer of elemental dopant (of a conductivity type opposite that of the substrate) over the surface layer of over a heavily doped semiconductor substrate; vacuum depositing metal onto the dopant film only in areas where diodes are desired; and alloying the metal, the dopant film, and the surface layer to form a tunnel diode junction. Subsequently, electrical conductors may be attached to the diode. Tunnel diode junctions produced in this manner lie substantially within a single crystallographic plane of the substrate, and have areas which are well defined both in size and in shape.

Thus it is an object of the present invention to provide a tunnel diode having a substantially planar junction.

It is another object of the invention to provide a tunnel diode the junction of which is substantially parallel to a single crystallographic plane of its substrate.

Another object of the present invention is to provide a method for producing a tunnel diode.

Yet another object of the present invention is to provide a method of producing a tunnel diode on a doped semiconductor substrate comprising chemical vapor-phase deposition of elemental dopant atop a semiconductor substrate.

A further object of the present invention is to provide a process for producing a tunnel diode comprising deposition of elemental dopant onto a degenerately doped semiconductor substrate, and alloying of a metal, the deposited dopant, and the semiconductor to form a tunnel junction.

Yet a further object of the present invention is to provide a tunnel diode strain transducer.

BRIEF DESCRIPTION OF THE DRAWINGS

These and other objects of the invention will become apparent from the following description taken in connection with the accompanying drawings, in which:

FIG. 1 illustrates in perspective view the various fabrication steps of the inventive tunnel diode. In particular:

FIG. 3 shows two views of a strain sensor embodiment of the inventive tunnel diode, wherein;

DESCRIPTION OF THE PREFERRED EMBODIMENT

Figure 1A:
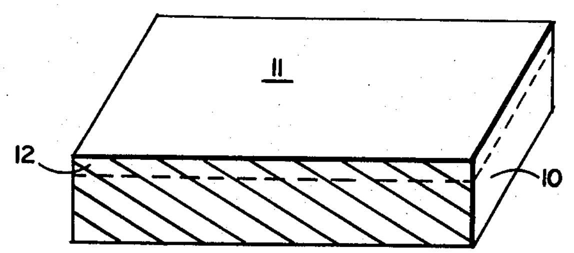
FIG. 1*a* shows the doped semiconductor substrate.
Figure 1B:
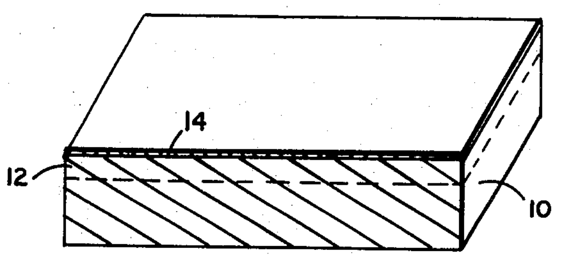
FIG. 1*b* shows a film of elemental dopant deposited atop the substrate shown in FIG. 1*a*.

The appearance of the inventive tunnel diode subsequent to each of its fabrication steps is shown in FIG. 1. In a preferred embodiment, the tunnel diode is fabricated on a substrate 10 of phosphorous doped, n-type silicon having 0.1 to 1.0 ohm centimeter resistivity. Such lightly doped silicon readily is obtainable free from mechanical defects and with homogenous resistivity. Substrate 10 may be of any appropriate shape. Initially, substrate 10 is cleaned with hot dichromic acid and polished in an appropriate etch (such as a mixture of hydrofluoric, nitric and acetic acids) to provide an extremely smooth, damage free deposition surface 11.

Initially, phosphorous is diffused into the top 11 of silicon substrate 10, in a manner well known to those skilled in the art, to form heavily doped surface layer 12. For example, degenerate layer 12 may be produced by heating substrate 10 to a temperature in the order of 1,150° C in a $P_2O_5$ atmosphere. Typically, layer 12 may have a thickness of at least 5 microns and a phorphorous concentration in the order of $10^{20}$. When so doped, layer 12 comprises a n-type degenerate region in which the Fermi level lies below the top of the valence band. Of course, degenerate semiconductor material could be used for the entire substrate 10, in which case the diffusion step would be unnecessary.

As a first step in the fabrication of the inventive tunnel diode, a uniform film 14 of elemental dopant is formed on surface 11 of degenerately doped substrate 10 by chemical vapor-phase deposition. The particular element selected for film 14 must provide impurities resulting in a region having a conductivity type opposite that of degenerate layer 12. Further, the element must be one which is soluble in a eutectic of the substrate material and a metal. Excellent tunnel diodes have been produced on a silicon substrate 10 (doped with phosphorous to form n-type layer 12) using elemental boron for film 14.

Figure 2:
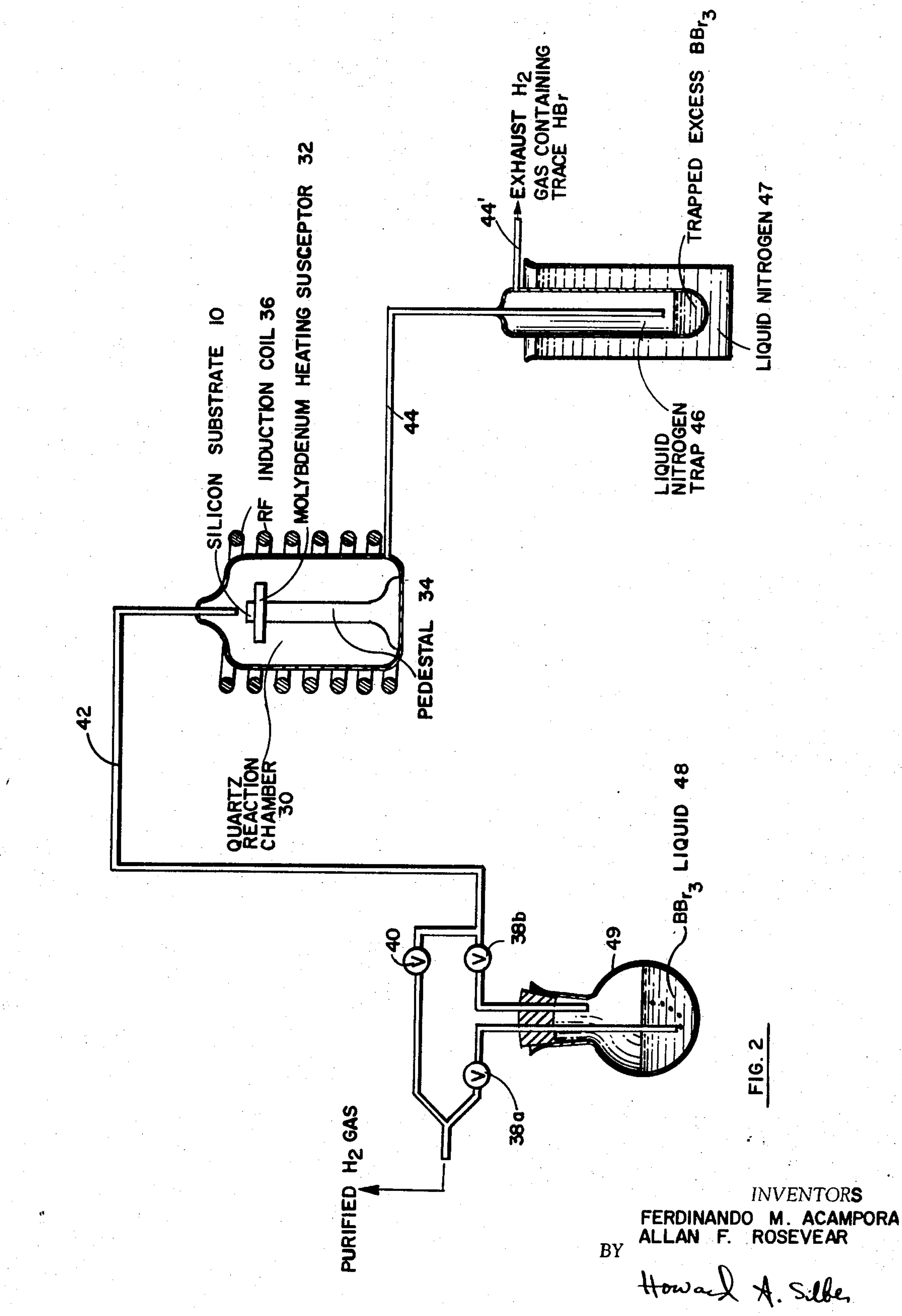
FIG. 2 is a simplified diagram of a chemical vapor-phase deposition system useful in the fabrication of the inventive tunnel diodes.

Elemental boron dopant film 14 may be formed by chemical vapor phase deposition using a system such as that illustrated in FIG. 2. Referring to FIG. 2, substrate 10 (containing degenerate region 12, as illustrated in FIG. 1*a*) is placed inside quartz reaction chamber 30, supported by molybdenum heating susceptor 32 and pedestal 34. RF induction heating coil 36, connected to an appropriate source of RF energy (not shown), is used to heat susceptor 32 and substrate 10.

To clean substrate 10, valves 38*a* and 38*b* each are closed, and valve 40 is opened. This allows purified hydrogen gas (from a source not shown in FIG. 2) to flow via tube 42 into quartz reaction chamber 30. The hydrogen gas is exhausted from chamber 30 via exhaust tubes 44 and 44', and liquid nitrogen trap 46. Sufficient cleaning of the substrate 10 to prepare it for subsequent boron deposition is achieved by heating substrate 10 to 1,000° C for 1 minute with hydrogen gas passing through the system. Substrate 10 is cooled subsequent to cleaning.

Next, valve 40 is closed and valves 38*a* and 38*b* opened to allow hydrogen gas to bubble through $BBr_3$ liquid 48, contained in flask 49, for sufficient time to saturate reaction chamber 30 with the resultant gaseous $H_2$ - $BBr_3$ mixture. With the gas flow rate reduced to a very low level, substrate 10 is heated to an elevated temperature, preferably in the range of 820° to 880° C. Elemental boron is deposited on surface 11 of heated substrate 12 according to the reaction:

$$2BBr_3 + 3H_2 \xrightarrow{heat} 2B + 6\,HBr \qquad (1)$$

The deposition is allowed to proceed until a boron film 14 (see FIG. 1*b*) of a desired thickness, preferably considerably less than 1 micron, has been achieved. Typically, a film 14 having a thickness satisfactory to produce excellent tunnel diodes may be deposited in about 15 seconds. The actual deposition rate will depend on the gas flow rate, the $BBr_3$, source temperature, and the temperature of substrate 10. Deposition may be stopped by closing valves 38*a* and 38*b*. At the end of this elemental dopant film 14 deposition step, the partially completed tunnel diode has the appearance illustrated in FIG. 1*b*.

During the boron deposition, exhaust $H_2$ (containing traces of HBr) and excess $BBr_3$ exit reaction chamber 30 via tubes 44 and 44'. The excess $BBr_3$ liquifies out in trap 46, which is submerged in liquid nitrogen 47, and may be reused by pouring it back into flask 49.

As a next step in the fabrication of the tunnel diodes, a layer of metal 16 is deposited over elemental dopant film 14 in areas at which tunnel junctions are desired. The size and shape of the junctions produced by this process will conform closely to that of deposited film layer 14. The metal used should be one which will readily form a eutectic or a melt with the substrate semiconductor material. The metal also should have high dopant solubility at temperatures below its metal melting point. Aluminum has been found to be particularly well suited for use with a silicon substrate 10 and a boron dopant film 14.

Metal layer 16 may be produced, in a manner well known to those skilled in the art, by evaporization of aluminum in a vacuum chamber contain substrate 10 and film 14. Preferably the metal is deposited through a mask having openings corresponding to the areas where diodes are desired. Alternatively, the exposed surface of elemental dopant film 14 may be covered with a layer of photoresist which is exposed and etched away in the areas where junctions are desired. Metal then may be deposited through the openings in the resist layer and the remaining layer then etched away. An aluminum layer 16 having a thickness of between 3 and 5 microns was found to produce excellent diodes. Subsequent to metal deposition, the resultant intermediate product resembles that shown in FIG. 1*c*. Although only one metal region 16 is shown in FIG. 1*c*, clearly, numerous tunnel diodes may be formed on the same substrate by providing additional metal regions at appropriate locations atop film 14.

Figure 1C:
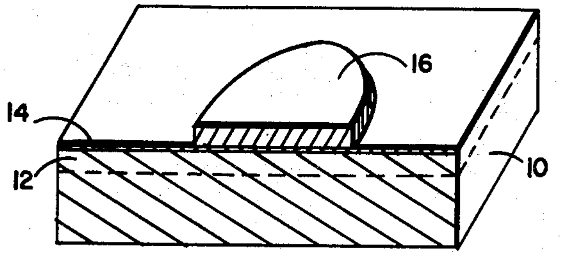
FIG. 1*c* illustrates the partially fabricated diode subsequent to deposition of metal in areas conforming to desired junction regions.
Figure 1D:
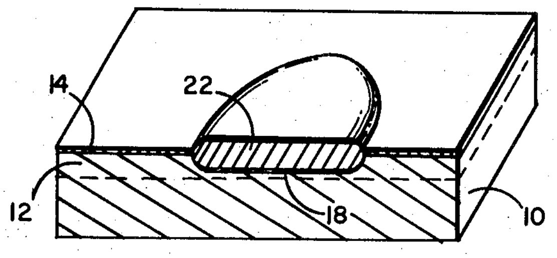
FIG. 1*d* illustrates the partially completed tunnel diode after alloying and quenching of the deposited layers.

The tunnel junction next is formed by alloying the structure shown in FIG. 1c, in a quartz reaction chamber such as that shown at 30 in FIG. 2. Use of a hydrogen atmosphere reduces impurity oxides which may form during the process. Alloying is accomplished by heating substrate 10 to approximately 950° C (well above the aluminum-silicon eutectic temperature of 570° C) and then rapidly lowering the temperature. The boron from elemental dopant film 14 is absorbed in the silicon-aluminum melt, and rapid quenching traps a high concentration of the boron dopant in a recrystallized silicon layer at the edge of the melt to form tunnel junction 18. This boron doped layer is p-type degenerate, that is, the characteristic Fermi level lies above the bottom of the conduction band. Typically, junction 18 has a thickness in the order of 150 Angstroms, and corresponds in shape and size to metal region 16 (see FIG. 1*c*). Considerable boron also is absorbed by the aluminum to form doped metal region 22.

Figure 1E:
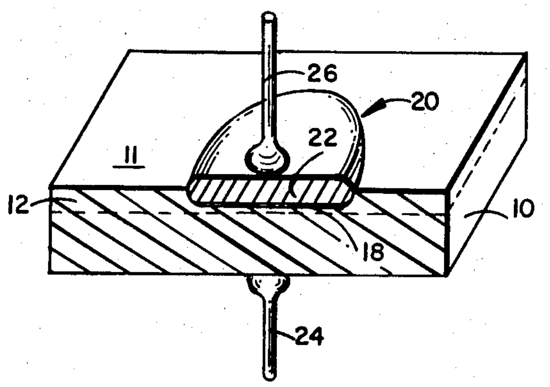
FIG. 1*e* shows the completed tunnel diode subsequent to attachment of electrical conductors.

Referring to FIG. 1e, tunnel diode 20 thus comprises p-type degenerate region 22, tunnel junction 18, and n-type degenerate semiconductor region 12. An elemental dopant film 14 remains over the remainder of substrate 10. Note that junction 18 is substantially flat or planar and is substantially parallel to substrate surface 11. Typically, junction 18 will be formed at a depth of about 3 to 5 microns below surface 11, the maximum depth generally corresponding to the thickness of metal layer 16.

Finally, appropriate electrical conductors 24 and 26 may be attached to substrate 10 and degenerate region 22 respectively to permit utilization of tunnel diode 20. As illustrated in FIG. 1*e*, connectors 24 and 26 may comprise nail head bonded wires. Alternatively other techniques, well known to those skilled in the art, may be used to provide connections to tunnel diode 20. For example, the top and bottom of the structure shown in FIG. 1*d* may be covered with a dielectric layer, e.g., of silicon dioxide, appropriate interconnection regions etched away, and metal evaporated onto the structure to provide electrical connections. This technique would allow incorporation of the inventive tunnel diode 20 into an integrated microelectronic circuit.

If desired, the dopant film 14 remaining subsequent to diode fabrication may be selectively etched away using, e.g., hydrochloric acid.

Various features of the inventive tunnel diode make it particularly useful as a strain sensor. First, the tunnel junctions 18 are flat, parallel to the surface 11 of substrate 10, and no greater in depth than the thickness (typically 3 to 5 microns) of metal layer 16 (see FIG. 1*c*) used in their fabrication. Second, by preparing deposition surface 11 (see FIG. 1*a*) parallel to one of the crystallographic planes of substrate 10, tunnel junctions 18 can be prepared which lie substantially within this single crystallographic plane. It has been found, e.g., that if silicon is used for substrate 10, flat junctions 18 useful for strain sensor applications, may be prepared in various silicon crystallographic planes including, but not limited to the (100), (111), and (110) surfaces. Flattest junctions were obtained in the (111) silicon plane. Third, since etching is not required to define the shape or size of the fabricated tunnel junctions, the junction strain fields are not disrupted as in conventionally formed tunnel diodes. Since the inventive tunnel diode does not have etched moats around the junction, it is apparent that the semiconductor substrate material coplanar with the junction extends uninterruptedly in all directions from the junction. Thus strains in the substrate coplanar with the junction are experienced by the junction without distortion.

Figure 3A:
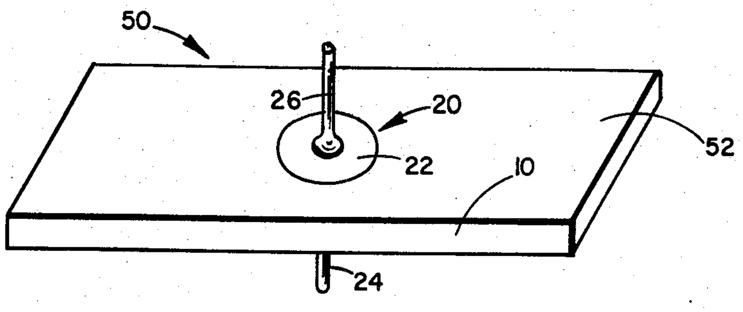
FIG. 3*a* illustrates the substrate in its relaxed state.
Figure 4:
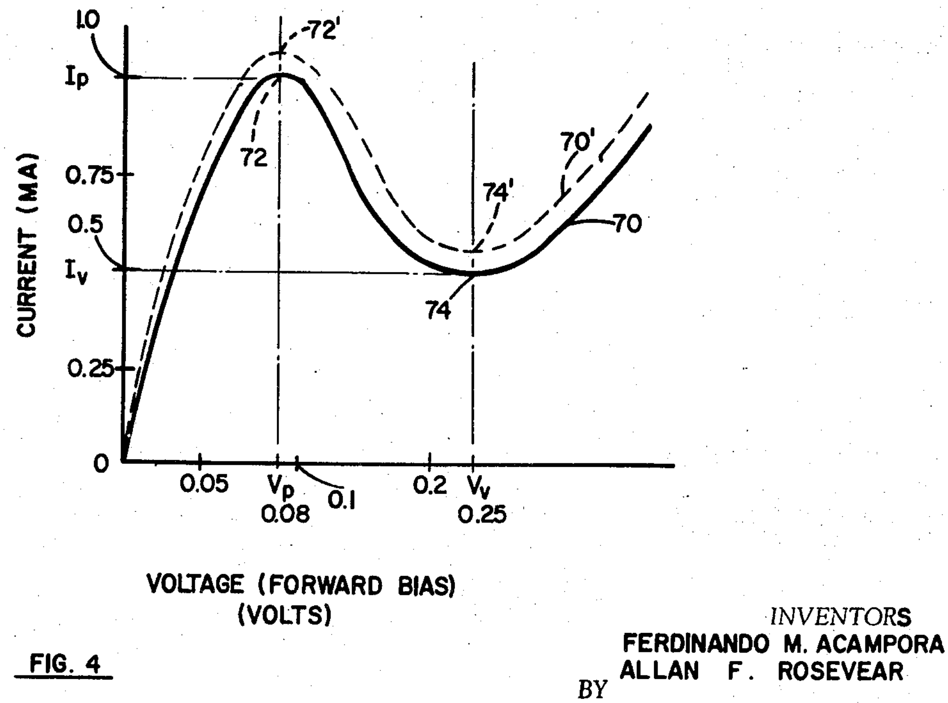
FIG. 4 is a graph showing current as a function of voltage (forward bias) for the inventive tunnel diode, under no-strain and strain conditions.

Referring to FIG. 3*a*, there is shown a strain sensor embodiment wherein a tunnel diode 20, fabricated in the manner illustrated in FIG. 1, is located in the center of an elongated beam 52 a portion of which serves as semiconductor substrate region 10 for diode 20. Although one tunnel diode 20 is shown in FIG. 3*a*, it is clear that a plurality of diodes may be fabricated on beam 52 to measure the strain at a corresponding plurality of locations in beam 52. Solid curve 70 of FIG. 4 graphically represents the typical current characteristics as a function of voltage for the tunnel diode 20 illustrated in FIG. 3*a*. It is to be understood that the values shown for the peak current $I_p$, valley current $I_v$, peak voltage $V_p$, and valley voltage $V_v$ are typical only, and will vary depending on the geometry of tunnel diode 20, the dopant concentration in the degenerate regions 12 and 22, and on the particular materials of which the diode is fabricated. However, the general shape of curve 70 is characteristic of all tunnel diodes, and includes a negative resistance region between the peak 72 and valley 74.

Figure 3B:
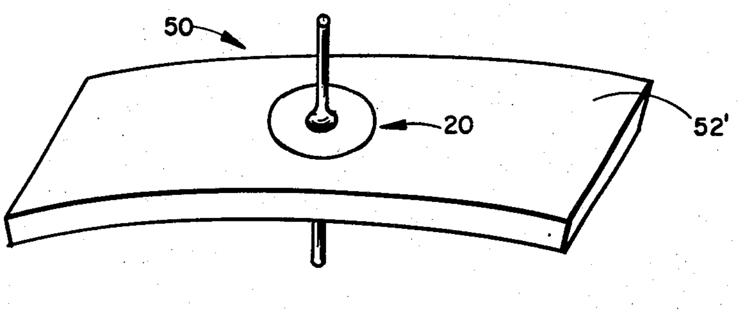
FIG. 3*b* illustrates deformation of the substrate when subjected to a bending stress.

When beam 52 (see FIG. 3*a*) is stressed, e.g., so as to cause it to bend into the shape illustrated by beam 52' in FIG. 3*b*, the resultant bending strain causes a variation in the current characteristics of tunnel diode 20. Typically, the bending strain experienced by beam 52' (see FIG. 3*b*) will result in an increase in the current through tunnel diode 20 for a given value of forward bias. Resultantly, the diode characteristics may assume the typical values indicated by dashed curve 70' in FIG. 4, including new values of peak current 72' and valley current 74'.

Figure 5:
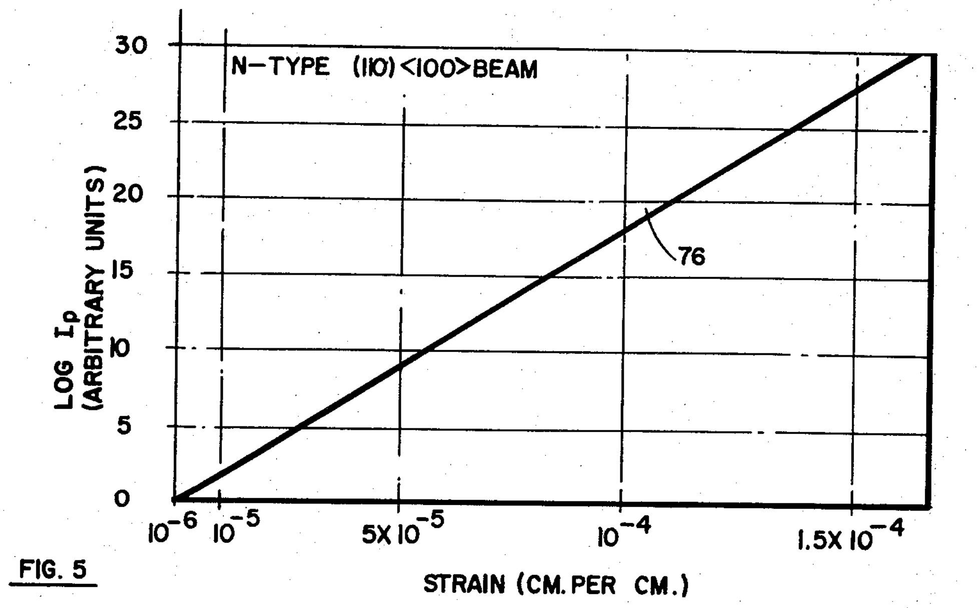
FIG. 5 is a graph showing the peak current through the inventive tunnel diode as a function of strain in the diode substrate.
Figure 6:
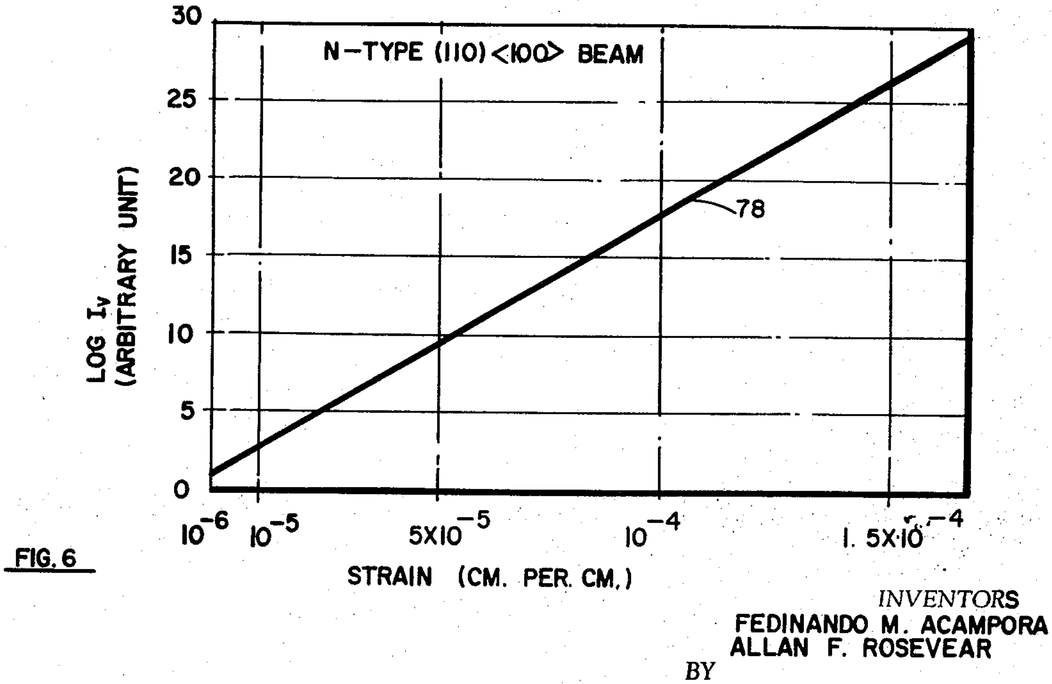
FIG. 6 is a graph showing the valley current through the inventive tunnel diode as a function of strain in the diode substrate.

Theoretical analysis of tunnel diode 20 indicated that the peak current 72 and the valley current 74 each should be logarithmically related to the magnitude of the strain. This has been verified experimentally, and is shown by the graphs of FIGS. 5 and 6. Curve 76 indicates typical values of the log peak current (Log $I_p$)

in arbitrary units as a function of strain for a tunnel diode 20 the junction of which lies in the (110) crystallographic plane of silicon beam 52. The strain was in the <100> crystallographic direction. Similarly, curve 78 indicates the straight line relationship between the log valley current (Log $I_v$) as a function of strain for the same diode. Similar, although not identical, strain sensitivity was experienced in other crystallographic directions.

Since beam 52 (see FIG. 3), when included in an appropriate structure (not shown) will experience bending strain under acceleration conditions, it is apparent that structure 50, including inventive tunnel diode 20, may be used as an accelerometer.

Although the invention has been described and illustrated in detail, it is to be understood that the same is by way of illustration and example only, and is not to be taken by way of limitation, the spirit and scope of this invention being limited only by the terms of the appended claims.

We claim:

1. A process for fabricating a tunnel diode on a semiconductor substrate at least a surface layer of which is degenerately doped, said process comprising the steps of:

chemical vapor phase depositing a film of elemental dopant of a conductivity type opposite that of said surface layer on a surface of said substrate, vacuum depositing a layer of metal on a selected area of said film, said area corresponding to the shape of said diode, and alloying a portion of said degenerately doped substrate, said dopant, and said metal to form a planar tunnel junction between the resultant doped metal region and a portion of said degenerately doped substrate.

2. The process as defined in claim 1 wherein said alloying step comprises heating said substrate, said film, and said layer to a temperature above the eutectic temperature of said metal and said semiconductor, then rapidly lowering the temperature.

3. The process as defined in claim 1 comprising the further step of attaching electrical conductors to said metal and said substrate.

4. The process as defined in claim 1 wherein said layer is deposited by vacuum evaporation through a mask.

5. The process as defined in claim 2 wherein said dopant comprises boron.

6. The process as defined in claim 5 wherein said film is prepared by chemical vapor phase deposition from a gaseous mixture comprising boron tribromide.

7. The process as defined in claim 5 wherein said metal is aluminum.

8. A process for fabricating a tunnel diode on a silicon semiconductor substrate comprising the steps of:

diffusing phosphorous into a surface of said substrate to form a heavily doped n-type surface layer;

chemical vapor phase depositing a film of boron on the surface of said N-type surface layer;

vacuum depositing a layer of aluminum on a selected area of said film of boron, said area corresponding to the shape of said diode; and alloying said substrate, said film and said layer of aluminum to a temperature above the eutectic temperature of said aluminum and said substrate, then rapidly lowering the temperature to form a planar tunnel junction between the resultant doped aluminum region and a portion of said doped surface layer.

* * * * *